United States Patent [19]

Guha et al.

[11] Patent Number: 4,695,859

[45] Date of Patent: Sep. 22, 1987

[54] THIN FILM LIGHT EMITTING DIODE, PHOTONIC CIRCUIT EMPLOYING SAID DIODE AND IMAGER EMPLOYING SAID CIRCUITS

[75] Inventors: Subhendu Guha, Troy; Satish Agarwal, Clawson, both of Mich.

[73] Assignee: Energy Conversion Devices, Inc., Troy, Mich.

[21] Appl. No.: 921,030

[22] Filed: Oct. 20, 1986

[51] Int. Cl.$^4$ .................... H01L 31/12; H01L 31/16
[52] U.S. Cl. ........................................ 357/19; 357/17; 357/2; 357/32; 357/30; 357/59
[58] Field of Search .................. 357/19, 58, 17, 59 C, 357/30 K, 2, 32, 59 D

[56] References Cited

U.S. PATENT DOCUMENTS

| | | | |
|---|---|---|---|
| 4,527,179 | 7/1985 | Yamazaki | 357/59 C |
| 4,581,744 | 4/1986 | Takamiya et al. | 357/17 |
| 4,591,893 | 5/1986 | Yamazaki | 357/30 K |

FOREIGN PATENT DOCUMENTS

| | | | |
|---|---|---|---|
| 0009491 | 1/1978 | Japan | 357/17 |
| 0189257 | 9/1985 | Japan | 357/30 K |

*Primary Examiner*—Martin H. Edlow
*Assistant Examiner*—D. Featherstone
*Attorney, Agent, or Firm*—Marvin S. Siskind; Richard M. Goldman

[57] ABSTRACT

A light emitting, thin film p-i-n diode characterized by aligned valence bands at the p-i interface and aligned conduction bands at the n-i interface and preferably including a layer of p-doped microcrystalline semiconductor alloy material. A photonic circuit fabricated as an integrated, solid state structure which includes a multilayered thin film light emitting element formed of semiconductor alloy material and a multilayered thin film light detecting element formed of semiconductor alloy material. The photonic circuit is particularly adapted for use as an integrated large area imager adapted to generate electrical signals corresponding to the image on an image-bearing document.

47 Claims, 7 Drawing Figures

THIN FILM LIGHT EMITTING DIODE, PHOTONIC CIRCUIT EMPLOYING SAID DIODE AND IMAGER EMPLOYING SAID CIRCUITS

FIELD OF THE INVENTION:

This invention relates generally to optoisolation devices and more particularly to thin film, solid state, integrated photoresponsive devices capable of emitting and detecting radiation. The present invention is particularly adapted to generate optical-to-electrical signals while maintaining electrical isolation between thin film integrated photonic circuit structures, including multilayered three dimensional, integrated photonic circuit structures.

BACKGROUND OF THE INVENTION

Photoresponsive semiconductor alloy materials and devices constructed using thin film technology have been extensively investigated in the last two decades. Recently, considerable efforts have been made to develop systems for depositing polycrystalline, microcrystalline and amorphous semiconductor alloy materials, each of which can encompass relatively large areas, and which can be doped to form p-type and n-type materials for the production of p-i-n and n-i-p type photovoltaic devices which are, in operation, substantially equivalent to their crystalline counterparts.

It is now possible to prepare amorphous silicon alloy materials by glow discharge or other vacuum deposition techniques, said materials possessing (1) acceptable concentrations (less than $10^{16}$ per cubic centimeter per eV) of localized defect states in the energy gaps thereof, and (2) high quality electrical and optical properties. Such amorphous materials and the associated deposition techniques are fully described in U.S. Pat. No. 4,226,898, entitled Amorphous Semiconductors Equivalent To Crystalline Semiconductors, issued in the names of Stanford R. Ovshinsky and Arun Madan on Oct. 7, 1980; U.S. Pat. No. 4,217,374, issued in the names of Stanford R. Ovshinsky and Masatsugu Izu on Aug. 12, 1980, also entitled Amorphous Semiconductors Equivalent To Crystalline Semiconductors; and U.S. Pat. No. 4,517,223, issued in the names of Stanford R. Ovshinsky, David D. Allred, Lee Walter, and Stephen J. Hudgens on May 14, 1985 and entitled Method Of Making Amorphous Semiconductor Alloys And Devices Using Microwave Energy. As disclosed in these patents, all of which are assigned to the assignee of the instant invention and the disclosures of which are incorporated by reference, fluorine introduced into the layers of amorphous silicon alloy material or amorphous silicon:germanium alloy material operates to substantially reduce the density of the localized defect states in the energy gap thereof and facilitates the addition of other alloying, compensating and doping elements.

It is also now known that photovoltaic device efficiency can be further enhanced by stacking multiple photovoltaic cells. More particularly, when these cells are arranged in serial optical and electrical fashion, each stacked cell is fabricated with a different band gap. This is accomplished by employing a photogenerative layer in each stacked cell characterized by a particular semiconductor alloy material in an effort to more efficiently collect therein only specific portions of the entire spectrum of available light incident upon the stack of cells. Specifically, such stacked structures can be fabricated so that in the first of the stacked cells a relatively wide band gap semiconductor alloy material, such as a silicon:carbon alloy material, absorbs only the shorter wavelength light while subsequent cells are fabricated of smaller band gap semiconductor alloy materials, such as a silicon alloy material and silicon:germanium alloy materials, so as to absorb the longer wavelengths of light which pass through the first cell. Such stacked cells not only include a plurality of successively deposited layers of semiconductor alloy material, but also preferably include a back reflector for increasing the percentage of incident light reflected from the substrate back through those layers of semiconductor alloy material from which the stacked cells are fabricated.

Through the inventive efforts of the assignee of the subject invention, it is now possible to successively deposit layers of semiconductor alloy material onto a large area substrate, such as a continuously moving web of substrate material. This type of large area deposition of successive layers of semiconductor alloy material of varying band gaps represents a deposition technique developed by the assignee of the subject invention, the applicability of which with respect to the solid state light emitting elements, light detecting elements and solid state photonic circuitry of the subject invention will be demonstrated in subsequent paragraphs of this background section of the instant specification.

It is also important to note that considerable efforts are also being made to fabricate related semiconductor devices which can be employed in the construction of integrated, solid state electro-optical circuits, the electronic components of which are fabricated of non-crystalline semiconductor alloy materials, such as amorphous silicon, amorphous germanium and amorphous silicon-germanium alloys. P-i-n type amorphous silicon:hydrogen alloy devices have been known since the work of Carlson at RCA in 1975, as described in U.S. Pat. No. 4,064,521, and the possibility that such amorphous silicon:hydrogen alloy and amorphous silicon:carbon alloy p-i-n type diode structures could be made light emitting was actually suggested as early as 1979 by Pankove, also working at RCA.

Such light emitting diodes operate to emit light due to the recombination of electrons from the conduction band and holes from the valence band which meet in the band gap of the particular semiconductor alloy material under consideration. Hence the width of the band gap of that particular semiconductor alloy material determines the wavelength of the light generated by the diode. However, because of the band gap structure of silicon:hydrogen alloys and germanium:hydrogen alloys, the recombination of electrons and holes in the band gap of these alloys at room temperature generates predominantly heat or photons in the infra-red region of the solar spectrum. Group III-V semiconductors such as gallium arsenide or indium phosphide have also been previously employed for the purpose of emitting infrared photons. Further, wider band gap single crystalline semiconductors such as gallium photphide or gallium-aluminum arsenide have been previously employed for emitting visible wavelengths of light.

It has further been found possible to link such solid state light emitting devices with light detecting devices, also in solid state crystalline format, for developing cross-communication therebetween. Such light detecting devices also rely on transitions occurring across the band gap of similar semiconductor materials, but the transitions are the reverse of the ones described for light emitters. More particularly, when a photon of incident radiation impinges on a semiconductor material, it excites an electron and creates a hole, provided of course that the photon energy is greater than the band gap of the semiconductor material. If, in addition to the incident radiation, a potential is placed across the semiconductor material, the photogenerated electrons and holes are forced to move in opposite directions and generate a photo-induced current which can be amplified and recorded. While such light detecting devices can be built from a uniform single layer of semiconductor material, in the crystalline world a p-n type junction is preferably employed. In this manner, a built-in electric field is incorporated about the junction region so as to aid in the collection of said excited electron-hole pairs. As a matter of fact, "avalanche photodiodes" have been constructed in which electrons and holes moving through a semiconductor material under the influence of a high electric field actually generate additional electron-hole pairs so as to amplify the electrical signal to be detected.

When fabricating amorphous light emitting diode structures, a plurality of very thin layers of thin film semiconductor alloy material of differing composition and conductivity-types are successively deposited so as to obtain the necessary electrical and optical properties to effectuate light emission in said structures. More particularly, successively deposited atop a substrate are layers of n-doped semiconductor alloy material, intrinsic semiconductor alloy material and p-doped semiconductor alloy material so as to provide a p-i-n diode. In order to emit light when such a diode is forward biased, it is necessary that holes from the p-doped layer of semiconductor alloy material and electrons from the n-doped layer of semiconductor alloy material be provided with efficient access to the intrinsic layer of semiconductor alloy material interposed therebetween. This access can be facilitated by aligning the conduction bands of the intrinsic and n-doped layers at the intrinsic n-doped interface for the efficient movement of electrons into the intrinsic layer and by aligning the valance bands of the intrinsic and p-doped layers at the intrinsic p-doped interface for the efficient movement of holes into the intrinsic layer. However, the intrinsic layer of semiconductor alloy material typically has a different band gap than that of either of the doped layers of semiconductor alloy material and, consequently, misalignment of the valence and conduction bands at the respective interfaces therebetween occurs. For instance, heretofore scientists have employed a p-doped amorphous silicon carbon hydrogen alloy layer and an n-doped amorphous silicon carbon hydrogen alloy layer with an intrinsic amorphous silicon carbon hydrogen alloy layer disposed therebetween in an attempt to match the corresponding valance and conduction bands of the layers at their respective interfaces. While this choice of materials caused the conduction bands at the n-doped and intrinsic layer interface to be aligned, the valence bands at the p-doped and intrinsic layer interface were misaligned. The result was the inefficient transfer of holes into the intrinsic layer with a correspondingly inefficient emission of light from the diode. It is therefore a first objective of the subject invention to align the valence bands at the p-doped: intrinsic layer interface as well as the conduction bands at the n-doped: intrinsic layer interface so as to provide a diode structure fabricated from amorphous semiconductor alloy material, which structure is characterized by the efficient generation and emission of photons of visible light.

As should be apparent from the foregoing discussion, the fabrication of light emitting structures, even if constructed as crystalline p-n diodes, is a very complex task which has heretofore been dependent upon the epitaxial growth of carefully lattice matched crystalline semiconductor materials. While, as also mentioned hereinabove, Pankove had suggested the ability of amorphous semiconductor alloy materials to function in a light emitting sense as early as 1979, until the subject invention, as detailed herein, scientists have struggled to fabricate visible light emitting diodes from amorphous semiconductor alloy materials. It is therefore another important object of the present invention to fabricate efficient light emitting diodes from amorphous semiconductor alloy materials generally and efficient light emitting diodes from amorphous silicon:carbon alloy materials specifically, which diodes include a layer of p-doped microcrystalline silicon alloy material. Further, by employing the fabrication techniques developed by the assignee of the subject invention, alluded to hereinabove, uniformity and homogeneity of micron-scale light emitting diodes is made possible.

One of the most important potential applications of such solid state, thin film light emitting diodes is as one of the active elements in a photonic circuit. As used herein, the term "photonic circuit" is defined as a circuit in which light rather than electricity is employed to generate, transmit, receive or process signals comprised of photons. A photonic circuit must not only be capable of converting electrical signals into light at the transmitting source of the signals, but must also be capable of converting the light back into electrical signals at the receiving end thereof. The inventors of the subject matter disclosed herein propose to integrate the previously detailed light emitting diodes fabricated from thin film semiconductor alloy materials along with solid state light detecting elements also fabricated from thin film semiconductor alloy materials, said light detecting elements adapted to convert the light generated by the light emitting elements into electronic pulses thereby providing photonic communication therebetween. In previously filed U.S. patent application Ser. No. 886,287 assigned to the assignee of the subject application, the inventors therein disclosed the use of non-linear, optically responsive semiconductor alloy material from which to fabricate photonic logic gates, said logic gates adapted to optically model the properties of the logical connectives AND, OR and NOT. In this manner, it was suggested that the disclosed photonic logic gates and specially fabricated thin film transistors could be employed as the basic building blocks of a photonic supercomputer. In line therewith, a second essential objective of the subject disclosure is the fabrication of a thin film, solid state light emitting diode which is operatively disposed in intercommunicative relationship with an integrated thin film, solid state light detecting diode so as to fabricate photonic circuitry which could be utilized as logic elements or as otherwise desired.

Such solid state, thin film, integrated electro-optical circuit structures may be fabricated in three dimensional format and are preferably constructed using multiple stacked layers of thin film materials including amorphous semiconductor alloy materials, metallic conductors and insulating materials deposited on a large area substrate such as the elongated web of substrate material alluded to hereinabove. As the number or the density of discrete solid state elements in such integrated circuit structures is increased, the efficient, economical and reliable interconnections between solid state elements located on vertically and/or spaced planes of the structure and the intercommunication between those solid state elements and electronic components located externally to the structure become increasingly important and exponentially complex. One aspect of such interconnective or intercommunicative paths, particularly in high density three dimensional structures, is electrical noise or cross-talk which can be generated between discrete solid state elements and conductors operatively disposed on the same plane, operatively disposed on different planes of the structure, or operatively disposed on conductors interconnecting the integrated structure to an external circuit element. It is yet a further objective of the subject invention to provide solid state, integrated deposition and fabrication techniques which provide interconnective and intercommunicative paths exhibiting inherently low susceptibility to electrical noise or cross-talk for minimizing potential signal attenuation.

One of the distinct advantages, as discussed hereinabove, of utilizing discrete, thin film, solid state elements and thin film, solid state integrated electronic and photonic structures is that they may be fabricated in large areas, thus making possible the implementation of very large scale integration (VLSI) and ultra-large scale integration (ULSI) electronic circuitry, without the use of costly micron or submicron geometries. Larger and much less expensive feature sizes, such as 5 microns to 20 microns or more may be used, since said layers of thin film semiconductor material may be reliably deposited and patterned over very large areas, with greater ease of fabrication and higher yields than their crystalline counterparts. Also, unlike crystalline silicon devices which must be epitaxially grown upon a crystalline silicon substrate, thereby enhancing the difficulty of building multiple layers of circuitry, thin film semiconductor alloy material may be deposited in multiple vertically separated layers or planes, thereby yielding truly three dimensional structures. Accordingly, the assignee of the present invention is developing ultra-large capacity three dimensional thin film amorphous semiconductor memories and the necessary technology to construct a fully integrated thin film central processing unit or computer which is not only fabricated from the amorphous semiconductor alloy materials, but which also employs the photonic concepts disclosed herein.

Finally, there has been a great deal of recent interest in the development of large area image scanning devices wherein amorphous semiconductor alloy material is utilized to fabricate the solid state elements which are capable of detecting the intensity of light reflected from an image-bearing document and generating an electrical signal responsive thereto. Those scientists engaged in such image scanning device development recognize the fact that one important technique for reducing the costs of large area image scanning devices is the simultaneous fabrication of the light emitting diode along with the light detecting device, such as a photodiode, on a common, large area substrate so that the light source would become an integrated part of the large area array of photosensitive elements. Not only would such integrated fabrication decrease manufacturing costs, but the light source would be fixed in operative disposition relative to the light detecting diodes as well as the image bearing document so as to optimize the intensity of image illumination and the reflection of said illumination onto the associated light sensitive array of solid state elements. Further, by employing the material design capabilities of the assignee of the subject invention, it is possible to fabricate photogenerative layers of semiconductor alloy material which are specifically tailored to (1) emit only desired wavelengths of radiation and (2) respond to those specific wavelengths of radiation generated by the light emitting element. It therefore is yet another object of the subject invention to fabricate discrete, integrated, solid state light emitting elements and light detecting elements through the vapor deposition of successive layers of semiconductor alloy material onto large area substrates.

Therefore, Applicants believe that through the utilization of the principles outlined herein, electro-optic technology and photonic circuit design has matured to the point at which it is now possible to forsee the evolution of optical integrated circuits that will require no electronics whatsoever. In the meantime, the integrated light emitting elements and light detecting elements of the subject invention will provide for the fabrication of a solid state, thin film, large area array of discrete, interconnected light sensitive elements which are readily adaptable for use in image scanning devices.

These as well as other objects, advantages and subsidiary capabilities of the subject invention will become more apparent from the detailed description of the drawings, the claims and the multiple figures which are disclosed in the following paragraphs.

BRIEF SUMMARY OF THE DISCLOSURE

In a first embodiment of the subject invention, there is disclosed a solid state light emitting diode formed from a plurality of layers of thin film semiconductor material, one of the layers of which is fabricated of a p-doped microcrystalline semiconductor alloy material. The diode further includes a photogenerative region adapted to generate photons of light in response to the recombination of electrons and holes therein, said recombination occurring upon the input of an external electrical stimulus. A substrate is provided upon which the successive layers of thin film n-doped, intrinsic and said p-doped semiconductor alloy material are disposed. The p-doped microcrystalline layer is preferably formed of a silicon:hydrogen alloy which may or may not be fluorinated. Preferably, the intrinsic layer, which forms the photogenerative region, is fabricated of an amorphous silicon:carbon alloy characterized by a band gap of approximately 2.0–3.0 eV and more particularly 2.2–2.8 eV. The n-doped layer is also fabricated of an amorphous silicon:carbon alloy material which preferably also includes hydrogen and fluorine. The p and n-doped layers thereof are approximately 250 to 750 angstroms thick and preferably 350 to 650 angstroms thick, while the intrinsic layer thereof is approximately 500 to 1,000 angstroms thick and preferably 650 to 850 angstroms thick. The light emitting diode may further include a light reflecting material disposed about at least a portion of the periphery thereof so as to direct photons of light generated in the intrinsic layer in a desired direction.

The light emitting diode described in the foregoing paragraph is specifically designed for use in the fabrication of a solid state, integrated photonic structure which also comprises an element for detecting radiation generated by the emitting diode, the detecting element being formed of a plurality of layers of thin film semiconductor alloy material. The detecting element is disposed in sufficient proximity to and includes a photogenerative layer having a band gap tailored so as to respond to radiation emanating from said light emitting diode. The light emitting diode and the light detecting element may be operatively disposed in spaced vertical planes, said elements being spaced from one another by a layer of transparent insulating material. Alternatively, a plurality of light emitting diodes and light detecting elements are employed and may be laterally spaced on a common substrate wherein the light emitting diodes are operatively disposed at the interstices of the light detecting elements. In those instances wherein the intrinsic layer of the light emitting diode is fabricated from an amorphous silicon:carbon alloy material, the intrinsic layer of the light detecting element is formed from an amorphous silicon:germanium alloy material which may or may not be hydrogenated and fluorinated. The relationship which must exist between the light emitting diode and the light detecting element is that the wavelengths of photonic energy emitted by the light emitting diode must be detectable by the photogenerative layer of the light detecting element.

Finally, there is disclosed herein an imager which includes an integrated, solid state, thin film array of light detecting elements and light emitting elements. The light emitting elements are adapted to direct light toward an image to be scanned and the detecting elements are adapted to receive said light as it is reflected from said scanned image and generate electrical signals corresponding to the quantity of light incident thereupon. To that end, the imager includes a substrate and a plurality of light emitting elements operatively disposed on said substrate, each element formed from a plurality of thin film layers of semiconductor alloy material and adapted to project light onto a proximately disposed image-bearing document to be scanned. A plurality of light detecting elements are also diposed on the substrate, each element formed from a plurality of thin film layers of semiconductor alloy material and adapted to detect the specific wavelengths of light reflected from said image-bearing document by said light emitting elements. The light detecting elements and the light emitting elements are fabricated as described in the foregoing paragraphs. In this imager embodiment, the light emitting elements and the light detecting elements are arranged in either a substantially coplanar or vertically spaced fashion with the light emitting elements located at the interstices which exist between adjacent light detecting elements. Further, in this embodiment, the light reflecting material is disposed about the periphery of the light emitting elements so that the light generated therefrom is directed toward the image-bearing document.

DETAILED DESCRIPTION OF THE DRAWINGS

I. The Large Area Imager

Figure 1:
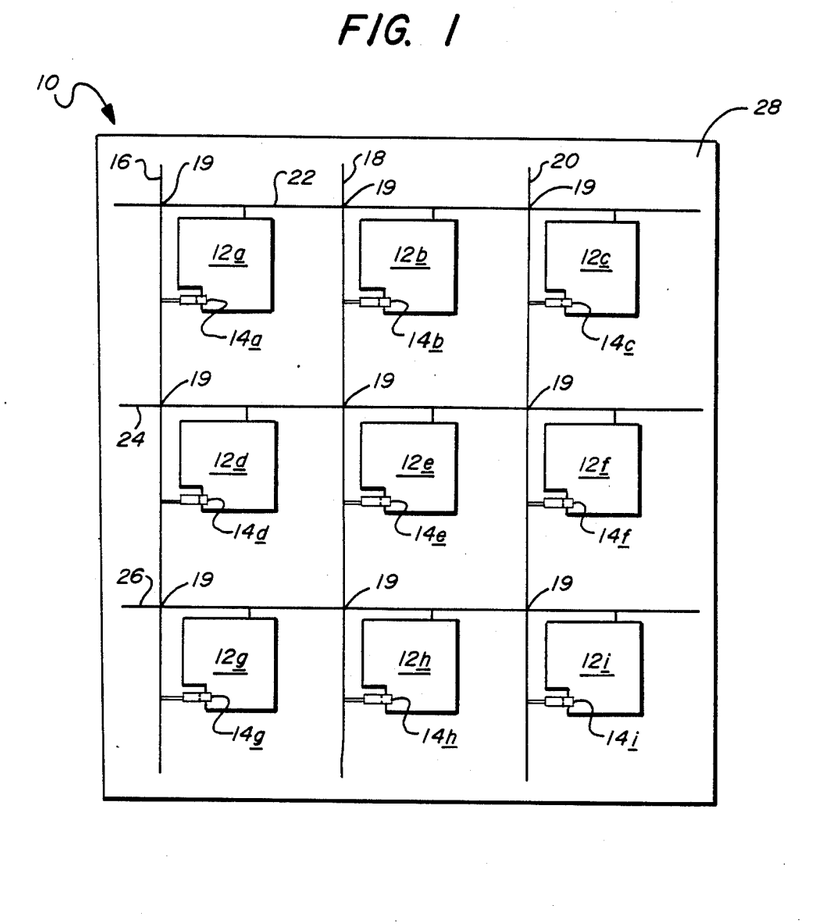
FIG. 1 is a top plan view of a large area, thin film, integrated imager of the type in which the photonic circuitry and light emitting diodes of the subject invention are readily employable.

In order to understand the operation of the light emitting diode of the subject invention, one preferred application for that light emitting diode will be described with reference to a large area matrix array of pixels or small area light sensitive elements utilized to electronically reproduce an image on a surface to be scanned. Referring therefore, specifically to FIG. 1, there is shown, in top plan view, one particular thin film array of photosensitive elements generally designated by the reference numeral 10, said array being typical of those with which the light emitting diodes of the present invention may be employed in cooperation with a light detecting or light sensitive element for scanning an image-bearing surface. It should be noted that FIG. 1 is merely examplary of one large area imaging array and that any other large area array or elongated m x 1 and 1 x n linear arrays may be similarly employed without departing from the spirit and scope of the instant invention.

The array 10 of photosensitive elements comprises a plurality of spaced photosensitive elements 12a–12i operatively disposed in a two-dimensional, m x n matrix form. Each of the photosensitive elements 12a–12i has associated therewith a discrete isolation device 14a–14i which interconnects that element 12 to a grid of address lines. As illustrated in FIG. 1, the grid of address lines includes a plurality of Y address lines 16, 18 and 20 and a plurality of X address lines 22, 24 and 26, each line formed of an electrically conductive material such as a metal or a thin film conductive oxide.

The array 10 of photosensitive elements is formed upon a large area substrate 28, which may be a rigid substrate such as a glass, or metallic plate, or a flexible member such as a thin metallic member, or a sheet of synthetic polymeric material. In those instances where the substrate 28 is electrically conductive and it is necessary to have discrete pixels addressed at different electrical potentials, it is necessary to provide an insulating coating thereatop prior to the deposition of the address lines thereon.

Each of the photosensitive elements 12a–12i are photoresponsive, that is to say they are adapted to produce a detectable electrical signal in response to the absorption of illumination. This signal may comprise a current, a voltage, a change in resistivity or the like. Among devices which may be utilized as photosensitive elements 12, are photodiodes, phototransistors, photoconductive devices, photovoltaic devices and the like taken either singly or in combination. One group of photosensitive devices having particular utility for signal generation are p-i-n photovoltaic diodes which are generally fabricated of two oppositely doped thin film layers of semiconductor alloy material having a photogenerative region of substantially intrinsic, thin film semiconductor alloy material disposed therebetween. Such devices may be used either singly or in stacked tandem combinations to produce voltage and/or current in response to the absorption of incident illumination. These photosensitive elements will be described in subsequent sections of this detailed description.

The isolation devices 14a-14i associated with each of the photosensitive elements 12a-12i, respectively, are utilized to restrict the flow of electrical current through the photosensitive array 10 to only predetermined paths so as to facilitate the discrete addressing of each particular photosensitive element 12. The isolation devices 14a-14i may comprise any type of current control device such as a diode, a transistor, a threshold switch, a relay or the like. In the most preferred form, p-i-n type diodes have been found to be particularly advantageous in terms of both cost and ease of fabrication and therefore are the isolation means of choice when employed in an imager, such as the large area imager array 10 which is adapted to reproduce the surface features of an image-bearing member.

The address lines 16, 18, 20, 22, 24 and 26 are operatively disposed in an X-Y matrix which is electrically isolated at cross-over points 19. By addressing particular pairs of address lines, distinct photosensitive elements 12 may be individually accessed. For example, by simultaneously pulsing X address line 24 and Y address line 18, photosensitive element 12e is individually accessed and the signal stored therein due to the quantity of illumination incident thereupon per unit time may be read. The presence of the blocking devices 14 on adjoining elements prevents electrical signals from addressing other of the tightly packed, small area pixels during such a reading procedure.

It should be apparent to one of ordinary skill in the art that while the photosensitive array 10 of FIG. 1 has been depicted and described as a two dimensional matrix comprising nine discrete photosensitive elements 12a-12i, in practicality, the 2-D array will comprise a much larger number of photosensitive elements. It will also be apparent that while the array 10 of FIG. 1 is depicted as a two dimensional array, the two dimensional configuration may be modified to provide a one dimensional, i.e., linear array of photosensitive elements such as a single row of elements 12a-12c or a single column of elements 12a, 12d and 12g. The details of operation and fabrication of both one and two dimensional photosensitive arrays are well known from scientific publications as well as patent literature and need not be detailed further herein.

Figure 2:
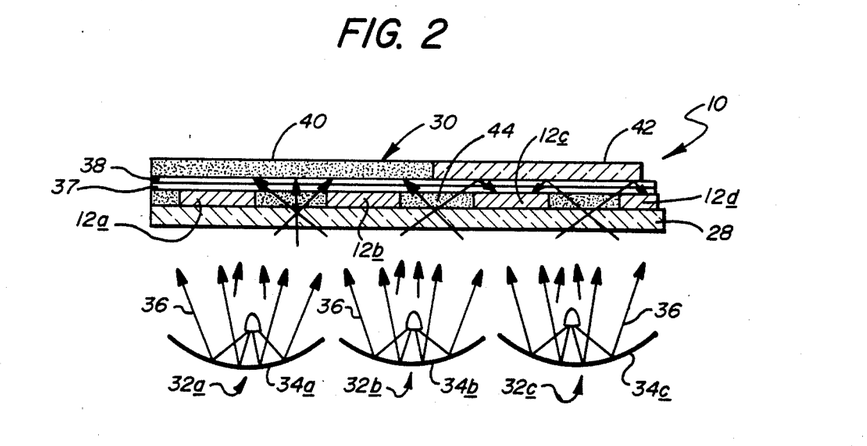
FIG. 2 is a cross-sectional side view of the imager of FIG. 1 illustrating the manner in which radiation from a plurality of proximate light sources is reflected from a document to be scanned onto associated light detecting photodiodes.

The operation of the document imaging array 10 illustrated and described with respect to FIG. 1 can be best understood by referring to FIG. 2 wherein said large area imager array 10 is shown operatively disposed for generating electrical signals representative of the image disposed upon an image-bearing member such as a document 30 located therabove. The imager array 10 accomplishes this signal generation by sensing the quantity of radiation emanating from light source 32a and 32c and reflected from said document 30 so as to be incident upon the light sensitive elements 12.

Referring now more particularly to FIG. 2, a plurality of individual light sources 32a, 32b and 32c are provided in close proximity to said image-bearing document 30. Associated with each of the sources 32a-32c are reflectors 34a-34c, respectively, adapted to provide diffuse light as indicated generally by the arrows 36, which light is projected onto the light detecting elements 12 of the imager array 10 disposed on the side of the substrate 28 opposite the surface thereof upon which the light sensitive elements 12 and the document 30 to be scanned are disposed. The document 30 is operatively disposed immediate atop an upper, hard, abrasion-resistance, transparent layer 38. The image-bearing document 30 includes at least one image-bearing portion 40 of high optical density, hereinafter referred to as the dark image-bearing portion of the document, and at least one image-bearing portion 42 of low optical density, hereinafter referred to as the light image-bearing portion of the document. The document receiving layer 38 is preferably deposited as a relatively thin film so that the image-bearing document 30 is closely spaced in juxtaposed relation to the light sensitive elements 12 for "proximity focusing" light reflected from the light and dark image-bearing portions of the document 30 onto associated ones of the light sensitive elements. The thickness of the document-receiving layer 38 is chosen to provide a maximized strength of the signal generated by the light sensitive elements 12 as consistent with a number of other variable parameters. These variable parameters include the angular distribution of the diffuse light intensity 36, the width of the light sensitive elements 12, and the spacing between adjacent light sensitive elements 12. While, in one embodiment, it is preferable that the thickness of the document-receiving layer 38, the width of the light sensitive elements 12 and the spacing between adjacent light sensitive elements 12 are all of a comparable dimension, in other preferred embodiments and depending upon the sensitivity of the light sensitive elements 12, the surface finish of the material from which the image-bearing document 30 is fabricated, the pressure with which the image-bearing document 30 is urged against the document-receiving layer 38 and the strength of the light signal 36, it has been found that a wide range of relative dimensions may be employed. The key element which typifies this type of "proximity focusing" is the presence of at least an approximately one-to-one relationship between the size of the small area portion of the image sensed by any given small area light sensitive element 12 and the size of the small area element 12 itself.

In one embodiment, the document-receiving layer 38 may be affixed to the substrate 28 by a transparent adhesive 44. The adhesive 44 is preferably a material having an index of refraction which matches the index of refraction of the transparent substrate 44 to that of the document-receiving layer 38 so as to minimize interference effects caused by the reflection of light from the interface surface boundaries.

In alternative preferred embodiments, the document-receiving layer 38 may be formed from a thin film of a transparent, abrasion-resistant material which is less than 1 micron thick, said film capable of being vacuum deposited directly atop the upper electrode of the light sensitive elements 12 so as to provide for integrated fabrication. In this embodiment, the document-receiving layer 38 is formed of a material selected from the group consisting essentially of wide band gap silicon-nitrogen alloys, silicon oxygen alloys, or silicon carbon alloys. These materials are transparent, hard, abrasion-resistant coatings, the fabrication parameters of which in, for instance, glow discharge deposition systems are well known to routineers in the art. In yet another, most preferred embodiment, the document-receiving layer 38 may be formed from a relatively thin (5,000 angstrom thick) film of diamond-like microcrystalline carbon which is prepared by the plasma glow discharge decomposition of a precursor carbon-containing gaseous reagent. Among some of the sources of carbon which may be employed in the practice of the instant invention are hydrocarbon gases such as methane, ethane, acetylene, and the vapors of organic liquids such as hexane and the like. Another group of carbon-containing compounds having utility are the halocarbons such as the various chlorine, fluorine, iodine and bromine compounds of carbon, which may or may not include hydrogen therein.

In the case of the 2-D imager illustrated in FIGS. 1 and 2, when the image-bearing document 30 is to be scanned, it is first placed over the imager array 10 in substantial contact with the transparent, document-receiving layer 38 or in contact with any other spacing or light collimating member so that the image-bearing document 30 is disposed in closely spaced juxtaposed relation to the light sensitive elements 12a-12i. Then, the light sources 32a-32c are energized for projecting diffuse light 36 onto the image-bearing surface of the document 30. In the dark portions 40 of the image on the document 30, the light will be substantially absorbed so that very little of the light impinging thereupon will be reflected back onto the associated light sensitive elements 12 disposed adjacent thereto, for example, light sensitive elements 12a and 12b. However, the light striking the light portions 42 of the image on the document 30 will not be substantially absorbed and a substantial portion of the light impinging upon the light portions 42 will be reflected back onto the associated light sensitive elements 12c and 12d disposed adjacent thereto. The light sensitive elements 12c and 12d disposed adjacent the light portions 42 of the image-bearing document 30 will thereby effect a detectable change in electrical conductivity. When, as in the preferred embodiment, the light sensitive elements 12 are formed as photodiodes, they will operate to photogenerate current. When the light sensitive elements 12 are formed as photoresistors, they will operate to effect increased electrical conductivity which can be detected by the application of read potentials to the respective pairs of the X address lines 22, 24 and 26 and the Y address lines 16, 18 and 20.

It is further preferred that a static shielding layer 37 be incorporated between the cover layer 38 and the top electrode of the light detecting diodes 12. This shielding layer 37 is incorporated because it was discovered that a static electrical charge of up to 600 volts or more could build up on the image-bearing document 30. It is possible that such a large static charge could induce a charge of similar magnitude in the light detecting elements 12 disposed immediately therebelow, which induced charge is capable of destroying the diode characteristics of those elements. Therefore, a thin film conductive layer, preferably formed of oxides of indium, tin, indium-tin, cadmium, zirconium or zinc, may be vacuum deposited between the light detecting elements 12 and the cover layer 38. By connecting this shielding layer 37 to ground potential (or to substantially the same potential as the light sensitive elements), the built-up static electrical charge on the image-bearing document 30 is unable to induce a similar charge in the light sensitive elements 12a-12i. As would be apparent to a routineer in the art, the thickness of the shielding layer 37 need only be sufficient to fully cover the light sensitive elements on which it is deposited, i.e., about 500 to 1500 angstroms. While the above referenced oxides constitute the preferred material from which to fabricate the shielding layer 37, other electrically conductive, transparent coatings such as metals may be employed with equal advantage.

Electrical signals representing a faithful reproduction of the image on the image-bearing document 30 can be generated because the light sensitive elements 12 can be made very small. For example, the light sensitive elements 12 can be fabricated to have dimensions of approximately 90 microns on a side. The isolating devices 14 can be fabricated to have a dimension of about 10-40 microns on a side and preferably 20 microns on a side. Also, the light sensitive elements 12 can be spaced apart so that they cover only a portion of the substrate 28 to permit light from the sources 32a-32c to be projected onto the image-bearing document 30 through the interstices which exist therebetween. For example, depending upon the conversion efficiency of the light sensitive elements 12 and the intensity of reflected illumination, the light sensitive elements 12 can be spacedly positioned to cover about 25-50% of the overall surface area of the substrate 28, although greater coverage is preferred so as to maximize the strength of the generated signal and provide for grey-scale operation. Also, it is preferable that the light sensitive elements 12 be arranged in substantially coplanar relation so that each will be equally spaced from the image-bearing document 30.

The electrical characteristic, and, in accordance with one preferred embodiment, the electrical conductivity of the light sensitive elements 12 can be detected by applying read potentials to respective pairs of the X and Y address lines in series, and one at a time. However, and in another most preferred embodiment, the light sensitive elements 12 can be divided into groups of elements and the read potentials can be applied to each group of light sensitive elements 12 in parallel to facilitate more rapid scanning of the image-bearing document 30. Of course, in this embodiment, within each group, the elements can be scanned in series.

It is to be noted that as used herein, the terms "light sensitive elements", "light detecting elements" and "photosensitive elements" are synonymously employed. Either term broadly refers to the photodiodes, photoresistors, phototransistors or the like which form the operative pixel elements 12a-12i of the FIG. 1 imager.

II. The Photosensitive Elements

As previously mentioned, although the instant invention may be practiced with a number of different types of photosensitive elements, such as photoresistors formed of cadmium sulfide, cadmium selenide, amorphous silicon, amorphous germanium or amorphous silicon germanium, the most preferred type of photosensitive element is a photovoltaic element which is capable of generating current and voltage upon illumination. Typically, low dark current photovoltaic cell structures are preferred. One such cell structure is a photodiode which is capable of operating in the fourth or power-generating quadrant of its I-V curve. In such fourth quadrant operation of photovoltaic structures, the amount of charge generated by each photosensitive element during a given frame or time period is directly proportional to the total amount of radiation incident upon that particular photosensitive element during that frame. Accordingly, the relative darkness or lightness of the small area portion of an image from an image-bearing document or other surface being scanned can be determined by measuring or sensing the total integrated charge which has been stored in each small area photosensitive element, the total integrated charge thereby corresponding to the small area portion of the image. In the following paragraphs, the physical structure and chemical composition of the photosensitive elements will be detailed.

Figure 3:
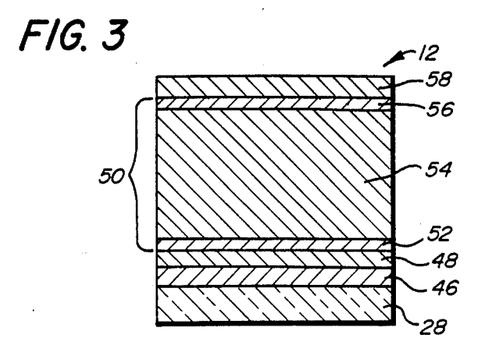
FIG. 3 is a cross-sectional side view illustrating the preferred multilayered configuration of the light detecting elements depicted in FIGS. 1 and 2.

Referring now to FIG. 3, there is illustrated a cross-sectional view of the configuration of an individual photosensitive element 12 which is typical of the configuration of any one of a plurality of such elements disposed in the large area array 10 of n-i-p type photodiodes discussed hereinabove with respect to FIGS. 1 and 2. While the photodiode 12 is preferably operatively disposed on a glass substrate 28, it is to be understood that in accordance with the inventive concept disclosed herein, the substrate of choice could be stainless steel or other opaque material. More particularly, utilizing the principles of the subject invention, it is no longer necessary that the substrate 28 of the large area imager array 10 be transparent so that the associated light source, such as 32, be capable of projecting light therethrough to strike an image-bearing document, such as 30, and be reflected onto an associated one of the photodiodes 12. This is because the integrated nature of the photodiodes 12 and the associated solid state light emitting elements, described in detail hereinafter, makes it possible to operatively dispose said light emitting elements on the same side of the substrate 28 as the photodiodes 12 and therefore the substrate 28 may be opaque.

Accordingly, the substrate 28 may be selected based solely on economic, environmental or constructional criteria and the choice of material includes thin metals, glass, ceramics or polymers, it simply being necessary to deposit an electrically conductive contact atop one surface of said substrate 28 if an insulating material is chosen from which to form the substrate. Operatively disposed atop the substrate 28 may be a layer of highly reflective material 46 such as silver, copper, aluminum, gold or the like, which layer 46 is approximately 500 to 1500 angstroms thick. Atop the exposed surface of the thin film layer of reflective material 46 is deposited a layer 48 of a passivating material which provides an interface between the reflective material 46 and the subsequently deposited body 50 of photosensitive semiconductor alloy material. Typical passivation materials may be selected from compounds such as zinc oxide, indium tin oxide, tin oxide, chromium oxide, cadmium stannate or the like. It should be noted however, that the use of a back reflective layer 46 is not essential to the photovoltaic operation of the photodiodes 12 and accordingly may be omitted. This is because the photoresponse of the photodiodes 12 fabricated in accordance with the teachings of the subject invention can be compositionally and configurationally fabricated to be extremely sensitive to particular wavelengths of radiation so as to generate a readily detectable electrical signal in response to said particular wavelengths. Therefore, the reflection of light back into the photogenerative region of the photodiode 12 is not necessary for the successful operation of the subject device. However, for purposes of increasing the photoresponse of the photodiode 12 and for facilitating the fabrication of the integrated, large area photonic array, a reflective layer 46 is preferred. This is because in the construction of the light emitting elements, a continuous layer of reflective material 46 and a correspondingly continuous layer of passivating material 48 is deposited upon the substrate 28 so as to direct light generated by said light emitting elements in a desired direction.

Above the reflective layer 46 and passivating layer 48 there is deposited an n-i-p type multilayered photodiode structure, generally.50, which is preferably formed by the successive deposition of layers of an n-type microcrystalline semiconductor alloy material 52, an intrinsic amorphous semiconductor alloy material 54 and a p-type microcrystalline semiconductor alloy material 56. It should be noted at this point that the terms "n-i-p-type structure" or "n-i-p-type diode" are meant to refer to all aggregations of n, i and p layers, without regard to the sequence thereof and is specifically intended to include p-i-n as well as n-i-p sequences of layers. Other semiconductor structures such as Schottky barriers, m-i-s devices, p-i-n devices, etc., may also provide a photoresponsive function with only minor changes as to the electronic circuitry employed so as to detect the photoresponse thereof to incident illumination.

The semiconductor alloy material from which the layers 52, 54 and 56 of the photodiode 12 are fabricated preferably include an alloy of silicon, germanium or germanium and silicon, including at least one density of states reducing element selected from the group consisting of hydrogen and fluorine. As used herein, the term "amorphous" includes all materials or alloys which have long range disorder, although they may have short or intermediate range order or even contain, at times, crystalline inclusions. Also, as used herein, the term "microcrystalline" is defined as a unique class of said amorphous semiconductor alloy materials characterized by a volume fraction of crystalline inclusions, said volume fraction of inclusions being greater than a threshold value at which the onset of substantial changes in certain key parameters such as electrical conductivity, band gap and absorption constant occurs. The doped layers 52 and 56 may each range in thickness from 50 to 500 angstroms and preferably each is approximately 100 angstroms thick. The intrinsic layer of photogenerative material 54 may range in thickness from 1000 angstroms to 8000 angstroms and preferably is about 3000 to 6000 angstroms thick.

An upper electrode 58, formed as a thin film layer of transparent, electrically conductive material such as, for example, indium tin oxide, tin oxide, zinc oxide, zirconium oxide, etc., is next deposited atop and in electrical communication with the top layer of the multilayered photodiode 12. The electrode layer 58 is generally about 400 to 800 angstroms thick, although its thickness may be varied as known to those in the art and is generally dependent upon such factors as the resistivity thereof and the subsequent processing steps which are to be performed.

Due to the fact that homogeneity and uniformity of each of the discrete, small area photodiodes 12 is essential, a large area substrate 28 as shown in FIG. 1 has said layers of semiconductor alloy material 52, 54 and 56 deposited thereupon in a continuous fashion. When the successive layers of semiconductor alloy material and the top electrode layer 58 are deposited, the individual, small area photodiodes 12 may be fabricated from the single large area photodiode by patterning the top electrode layer 58. The patterning may be accomplished employing photoresist techniques in conjunction with an acidic etchant, although a silk screen stencil may be utilized to apply a pattern of etchant reagent to achieve the desired pattern. As a result of patterning, the individual, small area photodiodes 12 are specifically defined. Because it is only necessary to remove the ITO layer, processing equipment, cost and time are reduced. This is made possible because the ITO can be deposited so as to be significantly more electrically conductive than the underlying layers of semiconductor alloy material and because the reading of each photodiode 12 occurs very quickly and therefore, photocurrents created under each photodiode 12 remain associated with that photodiode and not adjoining photodiodes. Therefore, the level of "cross-talk" due to leakage currents between adjacent small area photodiodes, such as 12a–12i in FIG. 1, is well below the level which could cause a significant degradation in the image reading capability of the large area array 10. And due to the fact that all of the semiconductor alloy material is simultaneously deposited, each of the small area photodiodes will exhibit substantially identical electrical, optical and compositional characteristics.

It is to be noted that the amorphous silicon, germanium or silicon:germanium alloys are deposited as a plurality of superposed layers by plasma-assisted chemical vapor deposition, i.e., glow discharge as disclosed, for example, in U.S. Pat. No. 4,485,389 which issued on Nov. 27, 1984 in the names of Stanford R. Ovshinsky and Masatsugu Izu, the disclosure of which is incorporated herein by reference. The important feature to be noted regarding the use of such silicon and germanium alloys, and as alluded to hereinabove, is that the collection efficiency of the p-i-n photodiode structure of FIG. 3 at one or more ranges of selected wavelengths of incident light may be altered or optimized by intentionally adjusting the band gap and/or thickness of each intrinsic layer 54. Such band gap adjustment techniques are well known in the art of amorphous semiconductor solar cell design and are disclosed, for example, in U.S. Pat. No. 4,342,044 which issued on July 27, 1982 in the names of Stanford R. Ovshinsky and Masatsugu Izu, the disclosure of which is also incorporated herein by reference. The collection efficiency for different wavelengths of light can also be optimized by the presence or absence of reflecting layers such as 46 and by varying the thickness of the upper electrode layer 58 or by the additional use of optical filters. In this regard, it should be noted that response to IR radiation is particularly desirable and the device can be tailored to respond thereto.

III. The Light Emitting Elements

As mentioned repeatedly hereinabove, the light emitting elements of the subject invention are preferably fabricated in the form of light emitting diodes. The diodes comprise thin film layers of successive glow discharge deposited silicon:carbon alloy material and thin film glow discharge deposited silicon alloy material as appropriately doped to form a p-i-n type configuration. Therefore, it should be readily apparent that the general structure of the light emitting elements will be substantially identical to the p-i-n diode structure described with reference to FIG. 3 in the previous section of this Detailed Description.

Figure 4:
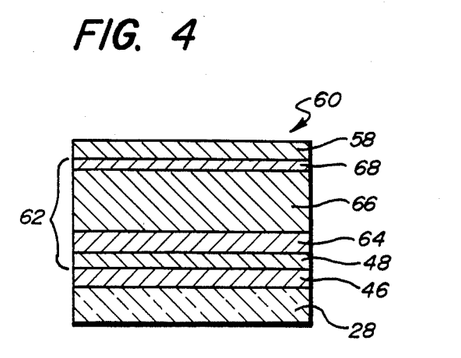
FIG. 4 is a cross-sectional side view illustrating the preferred multilayered configuration of the light emitting elements of the subject invention.

Referring now to FIG. 4, there is illustrated, in cross-section, the configuration of a single discrete light emitting element which is typical of the configuration of any one of a plurality of such elements adapted for operative disposition in the large area array 10 of FIGS. 1 and 2. In FIG. 4 and subsequent drawings, the light emitting elements will be illustrated generally by the reference numeral 60 and are preferably deposited on a common transparent or opaque substrate 28, such as stainless steel, glass, ceramics or synthetic plastic resin. Note that it will be necessary to deposit an electrically conductive contact atop one surface if an insulating material is selected as the material from which said substrate is formed. Operatively disposed atop the substrate 28 may be a layer of highly reflective material 46 such as silver, copper, aluminum, gold or the like (unless the substrate, itself, is formed from that reflective material), which layer is approximately 500 to 1500 angstroms thick. Atop the exposed surface of the thin film layer of reflective material 46 is deposited a layer of a passivating material 48 which provides an interface between the reflective material 46 and the subsequently deposited body 62 of semiconductor alloy material. Typical passivating materials may be selected from compounds such as zinc oxide, indium oxide, indium tin oxide, tin oxide, chromium oxide, cadmium stannate or the like. It is to be noted that unlike the light detecting elements 12, the light emitting elements 60 require that the light reflective material 46 be disposed about at least a portion of the periphery thereof so as to selectively direct light generated in the photogenerative region thereof to be emitted therefrom in a desired direction for photonic reception by other solid state elements.

Above the reflective layer 46 and passivating layer 48 there is deposited a n-i-p type multilayered photodiode structure, generally 62, which is preferably formed by the successive disposition of layers of an n-doped amorphous silicon carbon hydrogen fluorine phosphorous alloy material 64, an intrinsic amorphous silicon carbon hydrogen fluorine alloy-material 66 and a p-doped microcrystalline silicon hydrogen fluorine alloy material 68. The n-doped layer 64 may range in thickness from 200 to 600 angstroms and preferably 300 to 500 angstroms while the p-doped layer 68 may range in thickness from 500 to 1000 angstroms and preferably is 600 to 900 anstroms thick.

Examples of the typical glow discharge parameters for the fabrication of the layers of semiconductor alloy material 64, 66 and 68 which comprise the body 62 of the light emitting diode 60 will now be provided. For all of the layers of semiconductor alloy material a pressure of approximately 0.25 to 1.5 Torr, a substrate temperature of approximately 150° C. to 325° C. and a r.f. frequency of approximately 13.5 Mhz are employed to produce the glow discharge plasma. In order to deposit the p-doped layer 68, a precursor gaseous mixture of about 95 sccm of 1 percent silane in hydrogen gas, about 4.2 sccm of 1 percent boron trifluoride in hydrogen gas and about 25 sccm of hydrogen gas is introduced into the vacuumized deposition chamber. In order to deposit the intrinsic layer 66, a precursor gaseous mixture of about 3 sccm of silane, about 9 sccm of ethylene and about 5 sccm of silicon tetrafluoride is introduced into the vacuumized deposition chamber. Finally, in order to deposit the n-doped layer 64, a precursor gaseous mixture of about 2.5 sccm of silane, about 15 sccm of hydrogen gas, about 7 sccm of 500 ppm phosphine in silicon tetrafluoride and about 0.2 sccm of ethylene is introduced into the vacuumized deposition chamber. In this example, the p-doped layer is deposited to a thickness of about 400 angstroms and exhibits an optical gap of about 2.0 eV, the intrinsic layer is deposited to a thickness of about 600 to 800 angstroms and exhibits a band gap of about 2.4 eV and the n-doped layer is deposited to a thickness of about 500 angstroms and exhibits an optical gap of about 1.9 eV. In this manner, when an electrical potential is placed across the p-i-n layers of semiconductor alloy material so as to forward bias the light emitting diode 60, holes and electrons are recombined in the intrinsic layer 66 thereof and directed by the layer of reflective material 46 to be emitted through the p-layer 68. The photons of emitted light generated by diode 60, configured and constructed as specified hereinabove, range in wavelength from about 7500 to 10,000 angstroms and peak at a wavelength of approximately 8000 angstroms. Therefore, the emitted light from diode 60 appears reddish orange to the eye and a light detecting diode such as 12 in FIG. 3 can be specifically fabricated from a silicon:germanium semiconductor alloy material which is most responsive to those wavelengths of light.

Applicants have developed the semiconductor alloy materials from which the photogenerative body 50 of the light detecting element 12 is specifically tailored so as to be specifically responsive to the approximately 8000 angstrom wavelengths of radiation generated by the light emitting diode 60. This specifically engineered light detecting diode 12 has the p-doped microcrystalline layer of semiconductor alloy material 56 glow discharge deposited pursuant to the same deposition parameters and formed from the same precursor mixture as specified in the preceeding paragraph. The intrinsic layer of semiconductor alloy material 54 is also glow discharge deposited pursuant to the same deposition parameters, but formed from a gaseous precursor mixture of about 2 sccm of disilane, about 52 sccm of hydrogen gas, about 2.3 sccm of germane and about 1 sccm of silicon tetrafluoride so as to deposit approximately a 1.5 eV amorphous silicon germanium hydrogen fluorine alloy material specifically adapted to photogenerate electron-hole pairs in response to 8000 angstrom wavelengths of incident radiation emitted by the light emitting diode 60. Finally, the n-doped layer 52 is glow discharge deposited from a gaseous precursor mixture of about 2.5 sccm of silane, about 15 sccm of hydrogen gas and about 75 ccm of 500 ppm of phosphine in silicon tetrafluoride so as to deposit a microcrystalline silicon hydrogen fluorine phosphorous alloy material exhibiting a band gap of about 2.0 eV.

It should be noted that the use of a p-doped microcrystalline silicon hydrogen fluorine alloy was described in detail (as applied to solar cell design and fabrication) in commonly assigned U.S. Pat. No. 4,600,801, the disclosure of which is incorporated herein by reference. While such a microcrystalline p-doped layer of silicon alloy material presented particular advantages when employed in solar cells, such as increased conductivity and a wider band gap than conventional p-doped amorphous silicon hydrogen alloy materials, the use of such a p-doped silicon alloy layer in the ight emitting diode 60 of the subject invention brought further unexpected results. To begin with, the diode fabricated according to the specifications enumerated hereinabove, actually emitted light. As previously mentioned, it is no surprise that such amorphous silicon alloy diodes are capable of light emission; however, the fabrication of efficiently operating light emitting diode structures from thin film semiconductor alloy materials represents an important achievement. Previously, scientists had employed amorphous silicon carbon hydrogen alloy materials in each of the successively deposited p, i and n layers of semiconductor alloy material in an attempt to align the valence band of the p-doped layer with that of the intrinsic layer and the conduction band of the n-doped layer with that of the intrinsic layer by matching the band gaps of the semiconductor alloy materials from which each of the respective layers was fabricated. When the subject inventors employed this technique, they were unable to obtain efficient light emission. This was because the holes encountered a barrier to their movement into the intrinsic layer due to valence band misalignment at the p-i interface. However, when the inventors of the subject matter disclosed herein utilized a 2.0 eV band gap p-doped microcrystalline silicon hydrogen fluorine alloy layer in a p-i-n diode with a 2.4 eV band gap amorphous silicon carbon hydrogen fluorine intrinsic layer and a 1.9 eV band gap amorphous silicon carbon hydrogen fluorine n-doped layer, both the valence bands at the p-i interface and the conduction bands at the n-i interface were brought into substantial alignment and photons of light were efficiently emitted.

IV. The Photonic Circuits

Now that the light emitting diodes 60 and the light detecting diodes 12 of the instant invention have been described in detail, the use of those diodes in integrated, solid state light emitting and detecting photonic circuits for the specific purpose of reproducing the surface condition of an image-bearing member will be specifically described with reference to FIGS. 5-7.

Figure 7:
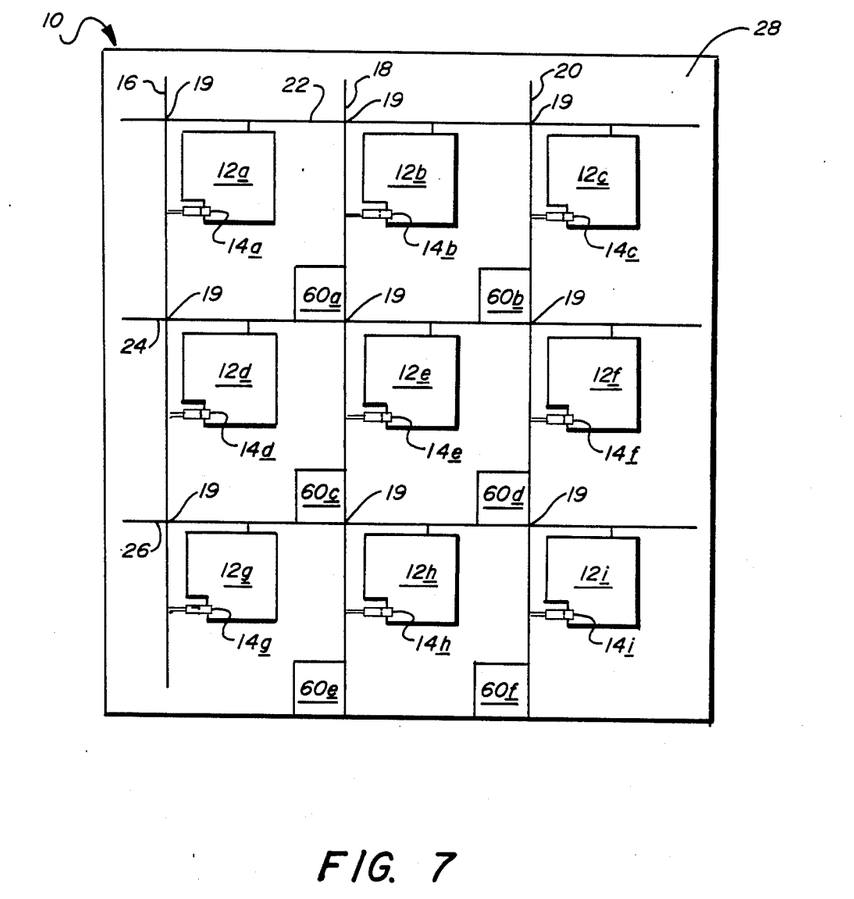
FIG. 7 is a top plan view of the integrated, solid state imager of FIG. 1 as configuratively arranged with the solid state light emitting diodes of the subject invention operatively disposed at the interstices of the light detecting elements.

Referring first to FIG. 7, there is illustrated a top plan view depicting the relative location of the light detecting elements 60 and the light emitting elements 12 on a large area 2-D imaging substrate 28, of the type shown and described with reference to FIG. 1. As should be apparent from a perusal of FIG. 7, the large area, integrated, solid state array 10, each one of the light emitting diodes 60a–60f is operatively disposed at each interstice defined between adjacent light detecting diodes 12a–12i. Of course, additional or fewer light emitting diodes 60 may be operatively disposed between adjacent light detecting diodes 12 depending upon the intensity of light emitted by the light emitting diodes 60 and the detection capabilities of the light detecting diodes 12.

Figure 5:
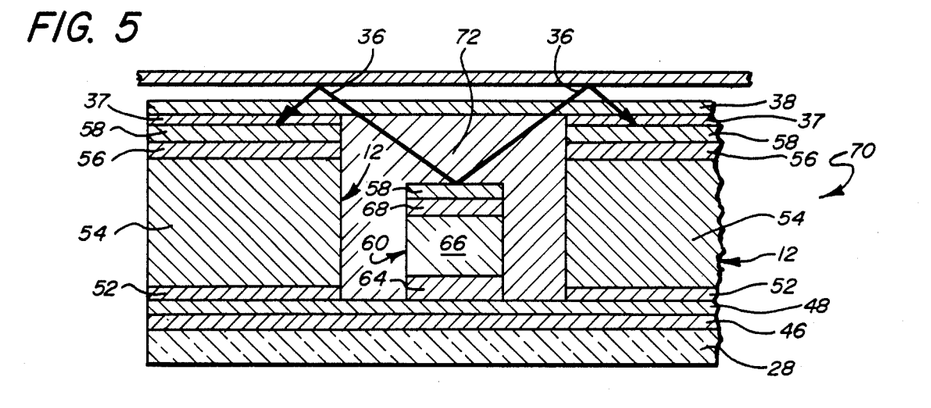
FIG. 5 is a cross-sectional side view of the light detecting element of FIG. 3 and the light emitting element of FIG. 4 operatively disposed in a coplanar arrangement and spacedly positioned beneath an image-bearing document in accordance with one embodiment of the subject invention.

FIG. 5 is a cross-sectional view depicting the operational disposition of the discrete elements of a solid state, integrated, thin film photonic circuit 70 configured in accordance with a first embodiment of the instant invention. In this embodiment, the p-i-n type light detecting diodes 12 are spacedly located on a common substrate 28 in a coplanar arrangement relative to the p-i-n light emitting diodes 60. Atop the substrate 28 which can be opaque, as described hereinabove, is deposited the thin film layer of highly reflective material 46 followed by the deposition of a thin film passivating layer 48. Next, the reflective layer 46 and the passivating layer 48 are masked and the thin film layers of semiconductor alloy material of the light detecting diodes 12 and the light emitting diodes 60 are spacedly deposited so that the diodes are configured, compositionally structured and operatively disposed relative to one another as illustrated and described in the previous sections of this specification. It should specifically be noted that light 36 is emitted from the light emitting diode 60, which light 36 is directed by the layer of reflective material 46 to strike and be reflected from a small area portion of the image on the surface of the document 30 to be scanned so as to be finally received by associated small area pixels formed by the light detecting diodes 12. The light detecting diodes 12 are then "read" by sensing the photogenerated current in any of the ways previously described. As should be appreciated by those skilled in the art, an electrically insulating material 72 such as silicon oxide is operatively disposed between each of the solid state elements of the photonic circuit 70 so as to substantially eliminate cross-talk therebetween. By fabricating the insulating material to be substantially opaque about the sides of the light emitting diode 60, light generated in the body 62 thereof can only be emitted through the p-layer 68 so as to be directed toward the image-bearing member 30.

Figure 6:
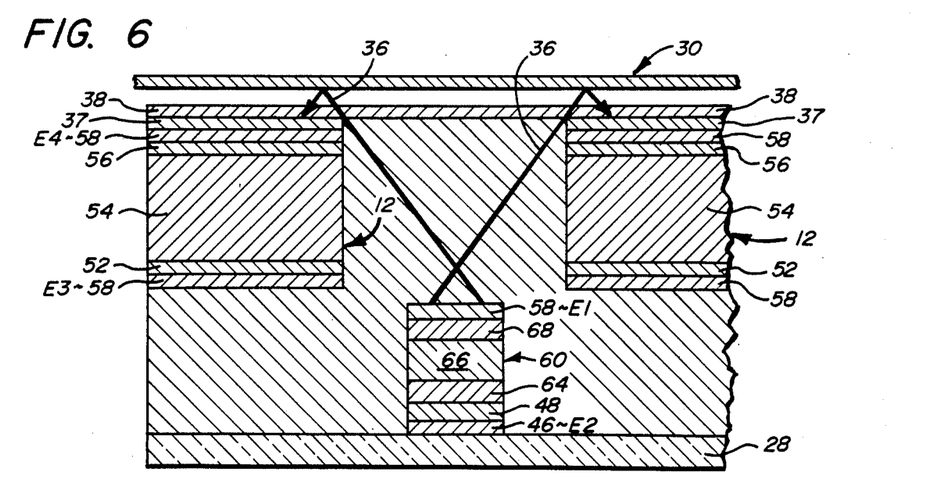
FIG. 6 is a cross-sectional side view of another of the light sensitive elements of FIG. 3 and light emitting elements of FIG. 4 operatively disposed in a vertically spaced arrangement in accordance with a further embodiment of the subject invention.

Finally, FIG. 6 illustrates a further embodiment 70' of the subject invention in which the light emitting diode 60 is deposited directly atop the passivating layer 48 and the reflecting layer 46 of the large area substrate 28. An electrically insulating material 72 is disposed on both sides of and atop the light emitting diode 60. Then the light detecting diode 12 is deposited atop the insulating material 72 in such a manner as not to block the passage of light 36 from the light emitting diode 60 toward the image-bearing document 30 and final incidence upon the light detecting diodes 12. Therefore, in this embodiment, the light emitting diode 60 and the light detecting diodes 12 will be vertically spaced or separated by a layer of insulating material 72; while the solid state elements will be horizontally positioned relative to one another as set forth in and previously described with respect to FIG. 7.

It should be noted with respect to the relative disposition of the light emitting elements 60 and the light detecting elements 12 that while they have been assigned preferred locations in the preceeding paragraphs, the only guiding principles by which the subject inventors have invoked such positioning are that (1) the light from the light emitting diodes 60 must be free to reach the image-bearing document 30 with full intensity, (2) the light reflected from the image-bearing document 30 must be reflected therefrom and received by the light detecting elements 12 without too great a diminution of intensity and (3) the size of each small area pixel defined by the matrix array 10 of FIG. 1 should be as small as possible to achieve the greatest possible image resolution.

As an examplary operation, the solid state photonic circuit 70' of FIG. 6 will be detailed. A suitable voltage and current are applied across the electrodes E1 and E2 of the light emitting diode 60, thereby initiating the generation of light 36 which is directed toward and reflected by the document 30 for detection by the light detecting diode 12. The light will be emitted when driven hard enough, i.e., when holes from the p layer 68 and electrons from the n layer 64 are injected into the intrinsic layer 66 in sufficient quantities to largely fill the defect states or traps present within the intrinsic semiconductor alloy material thereof, thereby providing a sufficient number of holes entering the valence band and a sufficient number of electrons entering the conduction band of the intrinsic semiconductor alloy material 66 to radiatively recombine and emit photons of light in random directions.

The photons created in intrinsic layer 66 are directed toward the image-bearing doucment 30 and are reflected therefrom and are received by the light detecting diode 12. These photons strike atoms within the bulk of the layer of intrinsic semiconductor alloy material 54 of the light detecting diode 12, thereby photogenerating electron-hole pairs, which photogenerated electron-hole pairs can be detected.

The preferred mode of operating the light detecting element 12 is to use it as a photovoltaic cell, and detect the voltage photogenerated in response to incident photons emanating from the light emitting diode 60. A detectable voltage will be generated across the photodiode 12 when the rate at which photons bombard the photogenerative intrinsic layer 54 thereof is sufficiently high. Under such conditions, the p-layer 56 and its associated conductive electrode 58 will become negatively charged and the n-layer 52 and its associated electrode 58 will become positively charged, thereby producing a voltage which can be sensed by other electrical circuits (not shown) but externally connected thereto.

Another mode of operating the photodiode 12 of FIG. 6 is to supply a voltage across the current-carrying electrodes E3 and E4 thereof. This mode works best when the layer of photogenerative material 54 is sufficiently depleted such that only reverse leakage current flows. To ensure that said photogenerative material 54 is sufficiently depleted, a bias voltage of approximately 5 to 10 volts (or more) may be applied across the electrode E4 and the electrode E3. When no photons, or only an insignificant number of photons, travel across the photogenerative intrinsic layer 54, the resistivity of said photogenerative layer 54 will be high (on the order of $10^5$ ohm-centimeters or more). In contrast, when a substantial number of photons are incident upon said photogenerative layer 54, the resistivity thereof will dramatically decrease due to the photogeneration of electron/hole pairs.

While for purposes of illustration and explanation, several forms of this invention have been disclosed, other forms thereof may become apparent to those skilled in the art upon reference to this disclosure and, therefore, this invention is to be limited only by the scope of the appended claims.

We claim:
1. A solid state, integrated photonic structure comprising:
 a substrate;
 means for emitting light in response to an applied electrical stimulus, said light emitting means formed of a plurality of layers of thin film semiconductor alloy material deposited on said substrate;
 means for detecting light emanating from the emitting means, said light detecting means formed of a plurality of layers of thin film semiconductor alloy material also deposited on said substrate;
 said light detecting means (1) disposed in sufficient proximity to and (2) including a photogenerative layer having a band gap tailored so as to generate a detectible signal in response to light emanating from said light emitting means; and
 said light emitting means and said light detecting means electrically isolated from one another by a layer of deposited insulating material.

2. A structure as in claim 1, wherein said light emitting means includes a layer of p-doped microcrystalline semiconductor alloy material.

3. A structure as in claim 2, wherein said light emitting means and said light detecting means are operatively disposed in vertically spaced planes.

4. A structure as in claim 1, wherein said light emitting means and said light detecting means are vertically spaced by a deposited layer of electrically insulating material.

5. A structure as in claim 2, wherein said light emitting means further includes a layer of light reflective material disposed about at least a portion of the periphery thereof for directing light emanating therefrom for reception by said light detecting means.

6. A structure as in claim 2, wherein said light emitting means and said light detecting means are laterally spaced in a common plane.

7. A structure as in claim 6, further including means disposed about at least a portion of the periphery of said plurality of layers of said light emitting means for directing light emanating therefrom for reception by said light detecting means.

8. A structure as in claim 7, wherein a layer of deposited electrically insulating material laterally spaces said light emitting means and said light detecting means.

9. A structure as in claim 2, wherein said light emitting means comprises a p-i-n-type diode.

10. A structure as in claim 1, wherein said light detecting means comprises a p-i-n-type diode.

11. A structure as in claim 1, wherein said detecting means comprises a p-i-n-type photoresistor.

12. A structure as in claim 3, wherein said light emitting means is laterally spaced as well as vertically spaced from said light detecting means.

13. A structure as in claim 12, wherein a layer of deposited electrically insulating material is disposed between the laterally and vertically spaced light emitting means and light detecting means.

14. A structure as in claim 1, wherein a plurality of said light detecting means and said light emitting means are disposed on said substrate and said light emitting means are operatively disposed at the interstices of said light detecting means.

15. A structure as in claim 2, wherein said light emitting means is a p-i-n diode in which the i-layer is fabricated from an amorphous silicon:carbon alloy material.

16. A structure as in claim 15, wherein the i-layer further includes fluorine and hydrogen.

17. A structure as in claim 15, wherein the i-layer is 500 to 1000 angstroms thick.

18. A structure as in claim 15, wherein the i-layer is compositionally tailored so as to be characterized by a band gap of 2.0–3.0 eV.

19. A structure as in claim 2, wherein said light emitting means includes a light generating layer fabricated from an amorphous silicon:carbon alloy and said light detecting means includes a photogenerative layer fabricated from an amorphous silicon:germanium alloy.

20. A structure as in claim 2, wherein said light emitting means includes a light generating layer fabricated from an amorphous carbon alloy and said photogenerative layer is fabricated from an amorphous silicon alloy.

21. A structure as in claim 2, wherein the light emitting means is adapted to generate wavelengths of light of 7500 to 10,000 angstroms.

22. A structure as in claim 2, wherein said light emitting means is a p-i-n diode from which photons are emitted adjacent the p-i interface.

23. A thin film, solid state light emitting diode including:
a substrate; and
continuous p-i-n layers of thin film semiconductor alloy material deposited on said substrate; said p layer fabricated of p-doped microcrystalline semiconductor alloy material; said i-layer fabricated of an amorphous silicon:carbon alloy characterized by a band gap of approximately 2.0–3.0 eV, whereby said diode is adapted to generate photons of light in response to an electrical stimulus.

24. A diode as in claim 23, wherein the p-doped layer of microcrystalline material is fabricated of a silicon:hydrogen alloy.

25. A diode as in claim 23, wherein the p-doped microcrystalline silicon:hydrogen alloy is fluorinated.

26. A diode as in claim 23, wherein the band gap of the intrinsic layer is approximately 2.2–2.8 eV.

27. A diode as in claim 23, wherein the n-doped layer is fabricated of an amorphous sillicon carbon alloy.

28. A diode as in claim 23, wherein the n-doped layer further includes hydrogen and fluorine.

29. A diode as in claim 23, wherein the p and n-doped layers are each approximately 200 to 750 angstroms thick and the intrinsic layer is approximately 500 to 1000 angstroms thick.

30. A diode as in claim 29, wherein the p and n-doped layers are each approximately 350 to 550 angstroms thick and the intrinsic layer is approximately 600 to 900 angstroms thick.

31. A diode as in claim 23, further including means disposed about at least a portion of the periphery of the light emitting diode for reflecting photons of light in a desired direction.

32. A diode as in claim 31, wherein the reflecting means is formed of a material selected from the group consisting essentially of aluminum, silver, gold, copper, or combinations thereof.

33. A diode as in claim 31, wherein the reflecting means comprises a thin film layer of reflective material covering all peripheral portions of said diode except the desired direction from which light is to be emitted.

34. A diode as in claim 31, further including a thin film passivating layer operatively disposed between the reflecting means and the diode.

35. A diode as in claim 34, wherein the passivating layer is formed of a material selected from the group consisting essentially of oxides of zinc, cadmium, zirconium, indium, tin or combinations thereof.

36. A diode as in claim 23, wherein photons are generated by the recombination of electrons and holes adjacent the p-i interface and light is emitted through said p-doped layer.

37. An imager including an integrated, solid state thin film array of light detecting elements and light emitting elements deposited on said substrate; said light emitting elements operationally composed and disposed to direct light toward an image to be detected and said light detecting elements operationally composed and disposed to receive light from said image to be detected and generate electrical signals corresponding to the quantity of light incident thereupon; said imager comprising, in combination:
a substrate;

a plurality of said light emitting elements spacedly disposed on said substrate, each light emitting element formed from a plurality of thin film layers of semiconductor alloy material and adpated to project light onto a proximately disposed image-bearing document to be scanned;

a plurality of said light detecting elements spacedly disposed on said substrate, each light detecting element formed from a plurality of thin film: layers of semiconductor alloy material and adapted to detect wavelengths of light generated by said light emitting elements and reflected from said image-bearing document; and said light emitting elements and said light detecting elements are electrically isolated from one another by a layer of transparent insulating material, whereby said light emitting elements and said light detecting elements are cooperatively structured to provide a solid state, integrated imager capable of generating detectible electrical signals corresponding to said image.

38. An imager as in claim 37, wherein each of said light emitting elements include a layer of p-doped microcrystalline semiconductor alloy material.

39. An imager as in claim 38, wherein each of said light emitting elements further includes a layer of intrinsic silicon:carbon alloy material.

40. An imager as in claim 37, wherein each of said light emitting elements and light detecting elements are formed as p-i-n type diodes.

41. An imager as in claim 40, wherein the intrinsic layer of each of said light emitting diodes is fabricated from a silicon:carbon alloy and the intrinsic layer of each of said light detecting diodes is fabricated from a silicon:germanium alloy.

42. An imager as in claim 40, wherein the light emitting diodes include intrinsic layers adapted to generate light of preselected wavelengths and the light detecting diodes include intrinsic layers adapted to detect light of said preselected wavelengths.

43. An imager as in claim 37, further including means for locating said image-bearing document to be scanned in close proximity to said array.

44. An imager as in claim 37, wherein said light emitting elements are operatively and spacedly disposed at the interstices formed between adjacent light detecting elements.

45. An imager as in claim 44, wherein said light emitting elements and said light detecting elements are disposed in substantially coplanar relationship.

46. An imager as in claim 44, wherein said light emitting elements and said light detecting elements are vertically spaced relative to one another.

47. An imager as in claim 37, further including reflecting means disposed about at least a portion of the periphery of the light emitting elements for directing light toward said image-bearing document.

* * * * *